United States Patent [19]

Kinoshita

[11] Patent Number: 5,453,640

[45] Date of Patent: Sep. 26, 1995

[54] SEMICONDUCTOR INTEGRATED CIRCUIT HAVING MOS MEMORY AND BIPOLAR PERIPHERALS

[75] Inventor: Yasushi Kinoshita, Tokyo, Japan

[73] Assignee: NEC Corporation, Tokyo, Japan

[21] Appl. No.: 359,996

[22] Filed: Dec. 20, 1994

[30] Foreign Application Priority Data

Dec. 22, 1993 [JP] Japan .................................. 5-322996

[51] Int. Cl.$^6$ .......................... H01L 29/06; H01L 27/11; H01L 27/04
[52] U.S. Cl. .......................... 257/520; 257/903; 257/904; 257/377; 257/382; 257/384; 257/383; 257/515
[58] Field of Search .................................. 257/903, 904, 257/734, 301, 304, 349, 360, 361, 370, 371, 394, 377, 382, 383, 384, 396, 397, 510, 515, 520, 902

[56] References Cited

U.S. PATENT DOCUMENTS

| | | | |
|---|---|---|---|
| 4,503,451 | 3/1985 | Lund et al. ............................ | 257/520 |
| 4,933,739 | 6/1990 | Harari .................................. | 257/904 |
| 4,960,726 | 10/1990 | Lechaton et al. .................... | 257/370 |
| 5,252,845 | 10/1993 | Kim et al. ............................ | 257/304 |
| 5,350,934 | 9/1994 | Matsuda ............................... | 257/515 |
| 5,357,132 | 10/1994 | Turner ................................. | 257/301 |
| 5,386,131 | 1/1995 | Sato .................................... | 257/301 |

FOREIGN PATENT DOCUMENTS

| | | | |
|---|---|---|---|
| 0172459 | 7/1988 | Japan .................................. | 257/520 |
| 0010565 | 1/1992 | Japan .................................. | 257/304 |

*Primary Examiner*—Mahshid D. Saadat
*Assistant Examiner*—Alexander Oscar Williams
*Attorney, Agent, or Firm*—Sughrue, Mion, Zinn, Macpeak & Seas

[57] ABSTRACT

In a semiconductor integrated circuit having a block of static memory cells using CMOS transistors and peripheral components using bipolar transistors, metal interconnections in a layer over the CMOS transistors on the substrate are simplified by using buried layers in the substrate as supply and ground lines for the CMOS transistors. This is accomplished by making buried contacts of a metal such as tungsten in each memory cell to make ohmic connection of the diffused layer of n-MOS transistors and the diffused layer of p-MOS transistors respectively to underlying buried layers of opposite conductivities and applying supply voltage or ground potential to each buried layer from the substrate surface by using additional buried contacts which are made at convenient locations outside the memory block. In the case of n-MOS memory cells using resistors or TFTs as load elements, ground potential is applied to the n-MOS transistors by the same method.

8 Claims, 7 Drawing Sheets

5,453,640

SEMICONDUCTOR INTEGRATED CIRCUIT HAVING MOS MEMORY AND BIPOLAR PERIPHERALS

BACKGROUND OF THE INVENTION

This invention relates to a semiconductor integrated circuit which has a static memory using MOS (metal oxide semiconductor) transistors and peripheral components using bipolar transistors, and more particularly to a novel means to provide a supply voltage and ground potential to MOS transistors in the memory.

In the recent semiconductor integrated circuits it is widely employed to fabricate both MOS transistors and bipolar transistors on a single substrate. A typical example is a so-called logic-in-memory devices having a memory using MOS transistors and logic circuits using bipolar transistors.

In conventional SRAMs (static random access memories) each memory cell is a flip-flop using MOS transistors, whereas bipolar transistors are used in decoder which is required of high-load driving and sense amplifier for amplification of very small currents.

In general, a static memory cell consists of a pair of driver transistors (MOS), a pair of load elements and a pair of data transmission transistors (MOS). Conventional static memory cells are grouped into three types by the type of the load elements. In the first type the load elements are resistors made of polysilicon, and in this case it is usual that the core part of the memory cell has a two-layer structure to fabricate the resistors in a layer above the MOS transistors on the substrate. In the second type the load elements are TFTs (thin-film transistors), and also in this case the TFTs are fabricated in a layer above the MOS transistors. In the third type the load elements are MOS transistors which are reverse in polarity to the driver and data transmission transistors, and in this case the load transistors are fabricated in the substrate together with the other MOS transistors. The third type is called CMOS (complimentary MOS) memory cell.

In SRAMs for general purposes often it is important to increase storage capacity by the employment of the aforementioned two-layer structure using resistors or TFTs as load elements. However, in the case of so-called Bi-CMOS SRAMs in which CMOS memory cells are combined with bipolar ECL (emitter coupled logic) peripherals, high speed operation is more important than increasing storage capacity in order to use, for example, as cache memories. In this case, therefore, it is favorable to employ CMOS memory cells which can be fabricated by a relatively simple process. Besides, the employment of CMOS memory cells augments the possibility of further reducing power consumption and enhance α-particle immunity. A recent development in the field of Bi-CMOS SRAM is reported in IEDM Technical Digest, 1992, pp. 39–42.

However, in the hitherto developed CMOS memory cells there are inconveniences in respect of interconnections. Usually interconnections are formed in two metal layers over the MOS transistors, and the metal line pattern in the first metal layer must include a supply voltage line and a ground line which are connected to the CMOS transistors. So, in the first metal layer the spacings between the interconnection lines become very narrow, and hence the patterning of the metal layer becomes troublesome. Since it is difficult to accomplish sufficiently good planarization in forming a metal layer over MOS memory cells, the patterning to form metal lines is liable to become inacuurate due to shortage of focus margin at the stage of exposure to light, and this problem becomes serious and leads to a decrease in the yield of acceptable products when the metal line spacings are very narrow. If it is intended to widen the spacings without decreasing the number of interconnection lines in a metal layer it is necessary to enlarge the memory cell area.

SUMMARY OF THE INVENTION

The present invention relates to a semiconductor integrated circuit which has a static memory using MOS transistors and peripheral components using bipolar transistors, and it is an object of the invention to simplify the process of forming interconnections for the memory by providing a novel means to apply a source voltage or ground potential to each of MOS transistors serving as elements of flip-flop in the memory cells.

In a semiconductor integrated circuit according to the invention, each memory cell has a pair of MOS transistors and a pair of load elements interconnected in the well known manner to constitute a flip-flop. According to the invention, ground potential is applied to the source of the aforementioned MOS transistors by using a first buried contact of a metal which is buried in the substrate to make ohmic connection of a diffused layer which provides the source of the MOS transistors to a buried layer which lies in the substrate under the diffused layer and is opposite in the type of conductivity to the diffused layer and a second buried contact of the same metal which is buried in the substrate at a location outside the memory block to apply ground potential to the buried layer from the substrate surface.

In the case of COMS memory cells, a supply voltage is applied to the source of MOS transistors used as load elements by using a third buried contact of the same metal which makes ohmic connection of the diffused layer of the load transistors to a second buried layer which lies under that diffused layer and another buried contact which is formed at a location outside the memory block to apply the supply voltage to the second buried layer.

As a metal of the buried contacts according to the invention it is desirable to use a high melting point metal such as tungsten. Furthermore, with a view to establishing very good ohmic connection of the buried contact to a silicon substrate, it is preferable to form a thin metal silicide layer at the interface between the buried contact and the silicon substrate.

In the substrate of an integrated circuit having bipolar circuits there are two types of buried layers, viz. an $n^+$-type buried layer to decrease the collector resistance of bipolar transistors and a $p^+$-type buried layer necessary for isolation of the bipolar transistor elements. When the integrated circuit includes MOS circuits, an n-type well to fabricate p-MOS transistors is formed above the $n^+$-type buried layer and a p-type well for n-MOS transistors above the $p^+$-type buried layer, and then an $n^+$-type diffused layer is formed in the p-type well and a $p^+$-type diffused layer in the n-type well.

In general the driver elements in an n-MOS memory cell (in which the load element are resistors or TFTs) are n-MOS transistors, and the source of the n-MOS transistors are connected to ground. The aforementioned $p^+$-type buried layer can be fixed at ground potential and hence can be used as a ground line for the source of the n-MOS transistors by burying suitable contacts in the substrate. In the case of a CMOS memory cell the load transistors are p-MOS transistors of which source is connected to a supply voltage. In this case the aforementioned n$^+$-type buried layer can be used as a supply line. The width of each of the n$^+$-type and p$^+$-type buried layers can be made wide enough to serve as a sort of interconnection line so far as the chip layout permits, though it is necessary that the spacing between the two types of buried layers is sufficient for p-and-n separtion.

In this invention, buried contacts of a metal are made in the substrate to establish ohmic connection of the n$^+$-type diffused layer of n-MOS transistors to the p$^+$-type buried layer and the p$^+$-type diffused layer of the p-MOS transistors to the n$^+$-type diffused layer. The buried contacts are made by forming holes, or trenches, in the substrate so as to reach the buried layer to be used as a ground or supply voltage line, and filling the holes with a suitable metal. Outside the memory block, ground potential and supply voltage can be applied to the buried layers from the substrate surface by using additional contacts which are buried in the substrate in the above-described manner.

By using the present invention, ground and supply lines can be omitted from the usual metal interconnections in a layer over the memory cells. Accordingly it is possible to widen the spacings between the interconnection lines to thereby ease the patterning of the metal layer and consequently increase the yield of acceptable products.

DESCRIPTION OF THE PREFERRED EMBODIMENTS

Figure 1:
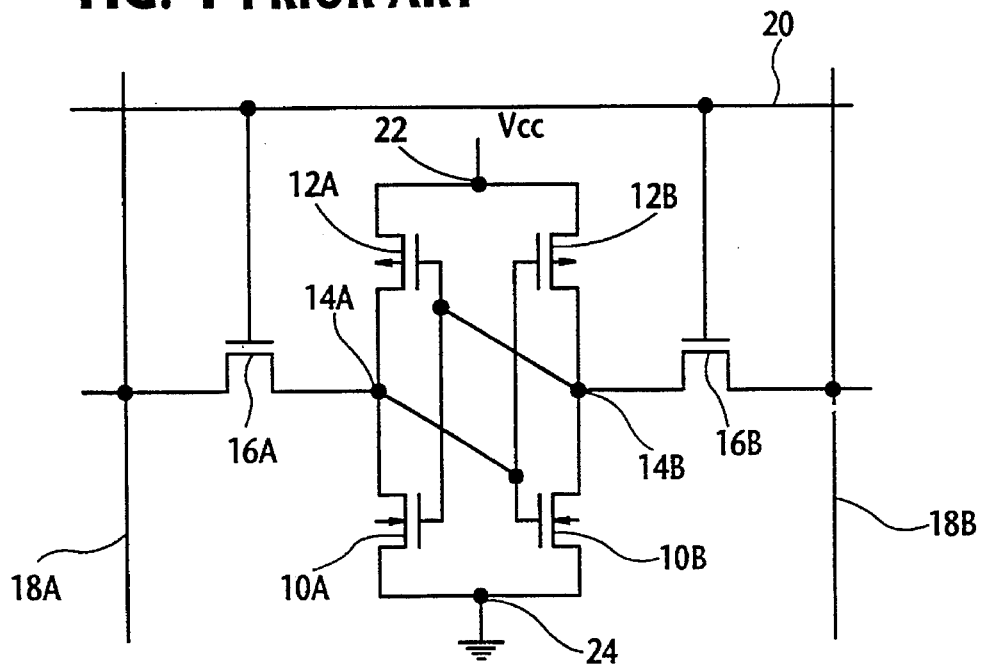
FIG. 1 is a circuit diagram of a static memory cell.

FIG. 1 shows the construction of a typical CMOS memory cell. A pair of driver transistors 10A, 10B and a pair of load transistors 12A, 12B are interconnected to constitute a flip-flop with input and output nodes 14A and 14B. A pair of data transmission transistors 16A and 16B provide connections of the input and output nodes 14A and 14B to a pair of complimentary bit lines 18A and 18B, respectively, and the gate of the these two transistors 16A, 16B is connected to a word line 20. Usually load transtors 12A, 12B are p-MOS transistors, and the driver transistors 10A, 10B and data transmission transistors 16A, 16B are n-MOS. The source of the p-MOS load transistors 12A, 12B is connected to supply voltage V$_{cc}$, and the source of the n-MOS driver transistors 10A, 10B is connected to ground. All of these six MOS transistors can be fabricated in a silicon substrate.

Figure 2:
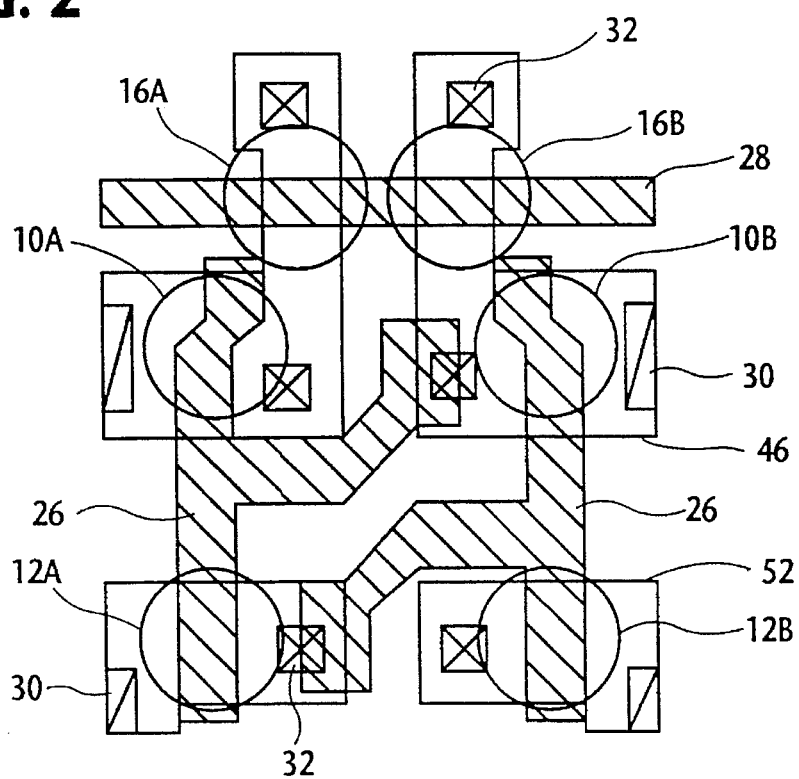
FIG. 2 shows a schematic layout pattern of a static memory cell in which the invention is embodied.

As an embodiment of the invention, FIG. 2 shows a layout pattern of a static memory cell of the type shown in FIG. 1. Indicated at 26 are gate electrode lines of polysilicon or polycide for the driver and load transistors 10A, 10B, 12A, 12B. For the data transmission transistors 16A, 16B there is a gate electrode line 28, which corresponds to the word line 20 in FIG. 1. An n$^+$-type diffused layer 46 for the n-MOS transistors 10A, 10B, 16A, 16B and a p$^+$-type diffused layer 52 for the p-MOS transistors 12A, 12B are formed in the substrate (not indicated in FIG. 1). According to the invention, a buried contact 30 is provided to each of the driver and load transistors 10A, 10B, 12A, 12B to make ohmic connection of the n$^+$-type diffused layer 46 to an underlying p-type buried layer or the p$^+$-type diffused layer 52 to an underlying n-type buried layer.

Figure 3:
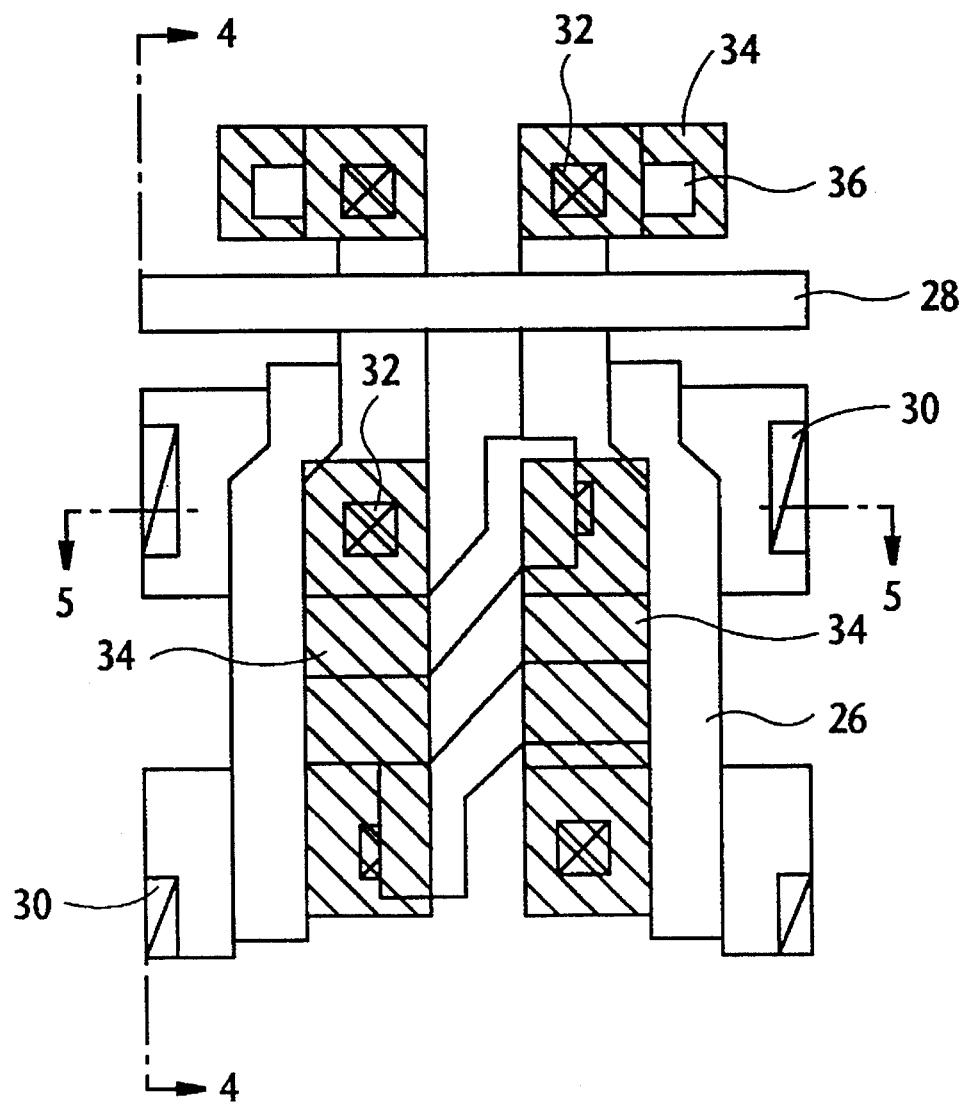
FIG. 3 shows a metal interconnection pattern formed over the memory cell of FIG. 2.

FIG. 3 shows aluminum interconnections 34 in a first metal layer which is formed over the memory cell of FIG. 2 after forming an insulating layer (not indicated). Contact holes 32 shown in FIG. 2 are used for the connection of the aluminum interconnections 34 to the gate electrode lines 26, n$^+$-type diffused layer 46 or the p$^+$-type diffused layer 52. Indicated at 36 are via holes used to connect the interconnections 34 to a second metal layer (not shown) which is to be formed over the first metal layer (34). The interconnections in the second metal layer include two parallel lines corresponding to the bit lines 18A, 18B in FIG. 1.

Figure 4:
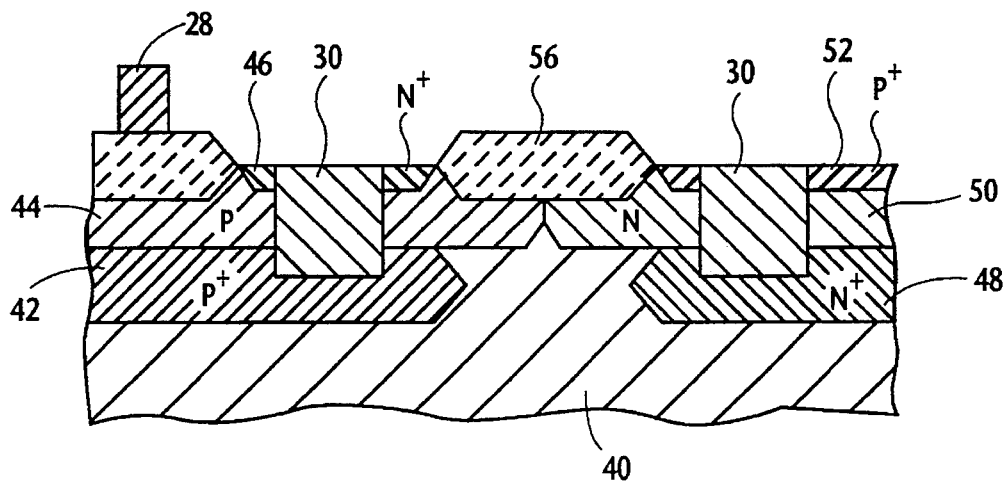
FIGS. 4 and 5 are schematic sectional views taken along the line 4—4 and line 5—5 in FIG. 3, respectively.
Figure 5:
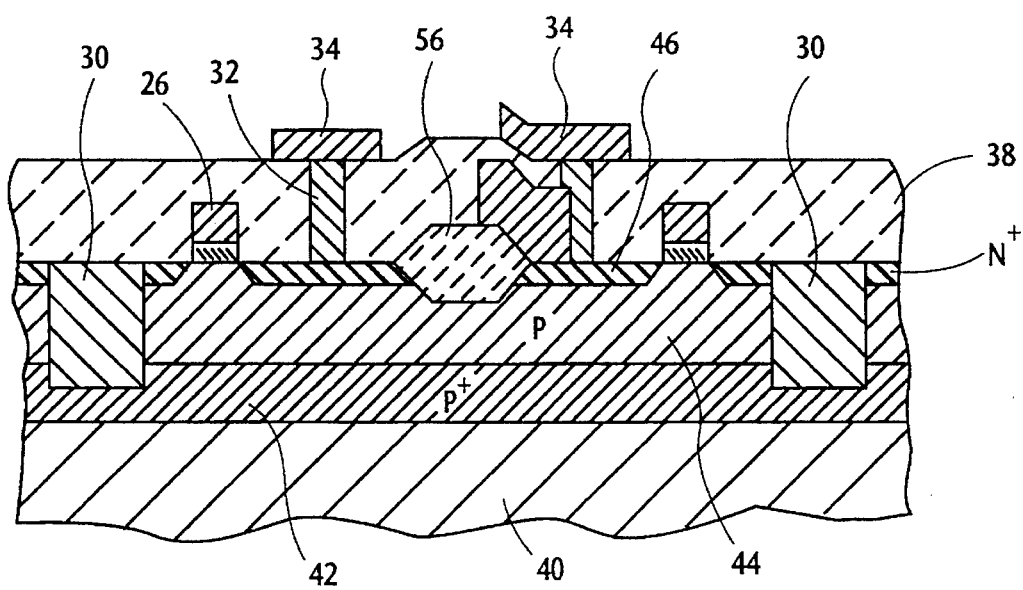

The buried contacts 30 are cleary shown in the sectional views in FIGS. 4 and 5. In a silicon substrate 40 a p$^+$-type buried layer 42 and an n$^+$-type buried layer 48 are formed in order to fabricate bipolar transistors (not shown) in other regions of the substrate. For the MOS transistors in FIG. 2, a p-type well 44 and an n$^+$-type diffused layer 46 are formed above the p$^+$-type buried layer 42, and an n-type well 50 and a p$^+$-type diffused layer 52 above the n$^+$-type buried layer 48. Indicated at 56 is a field oxide film for isolation of components. In FIG. 5 it is seen that the aluminum interconnections 34 (first metal layer) are formed on an insulating layer 38. The buried contact 30 for each n-MOS transistor 10A, 10B, 16A, 16B is buried in the n$^+$-type diffused layer 46 and the underlying p-type well 44 to penetrate into the p$^+$-type buried layer 42. The buried contact 30 for each p-MOS transistor 14a, 14b is buried in the p$^+$-type diffused layer 52 and the underlying n-type well 50 to penetrate into the n$^+$-type buried layer 48.

FIGS. 6 to 9 illustrates a process of making the buried contacts 30.

Figure 6:
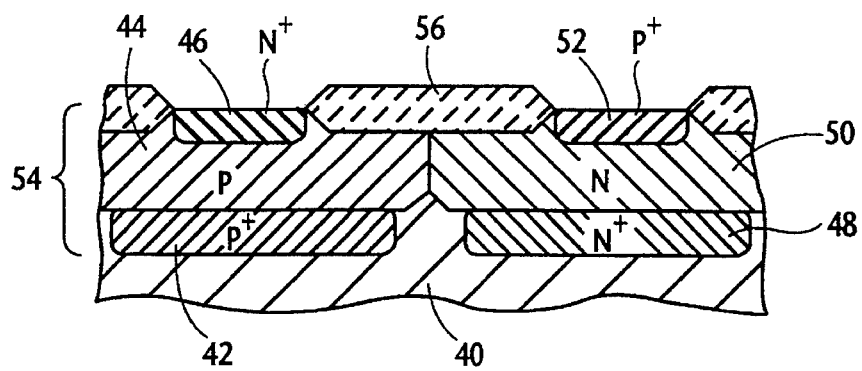
FIGS. 6 to 9 illustrates, in schematic sectional views, a process of making buried contacts in the memory cell of FIGS. 2–5.

Referring to FIG. 6, the p$^+$-buried layer 42 and the n$^+$-type buried layer 48 are formed in the silicon substrate 40 by introducing boron ion and arsenic ion, respectively. Next, a silicon layer 54 is epitaxially grown to a thickness of 0.5–2.0 µm, and the oxide film 56 for isolation is formed by LOCOS (local oxidation of silicon) method. Then, the p-type and n-type wells 44 and 50 are formed above the p$^+$-type and n$^+$-type buried layers 42 and 48, respectively, by a conventional technique such as ion implantation. Next, gate electrodes of MOS transistors are formed in predetermined regions (not shown in FIGS. 6–9) by using polysilicon or polycide, and an oxide sidewall is formed on the side faces of the gate electrodes. After that, the n$^+$-type diffused layer 46 above the p-type well 44 and the p$^+$-type diffused layer 52 above the n-type well 50 are formed by a conventional technique such as ion implantation.

Figure 7:
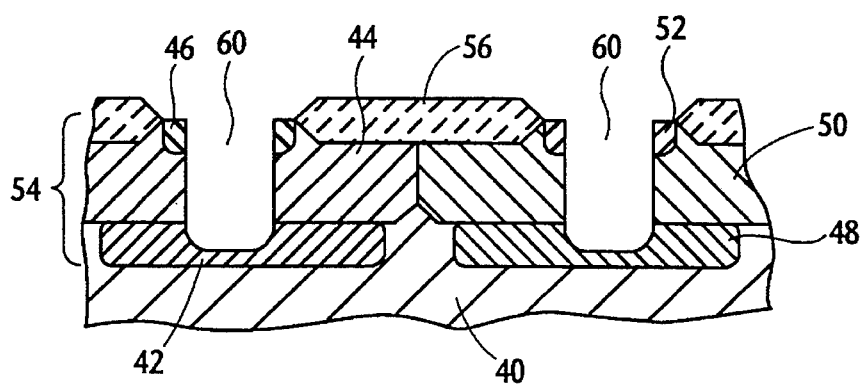

FIG. 7 shows the first step of making the buried contacts 30. For each buried contact 30, a contact hole 60 in the shape of a slit is formed in the Si epitaxial layer 54 so as to penetrate into the p$^+$-type buried layer 42 through the $n^+$-type diffused layer 46 and the p-type well 44 or into the $n^+$-type buried layer 48 through the $p^+$-type diffused layer 52 and the n-type well 50. The slit-like contact holes 60 are formed by trench etching of silicon with masking over the major areas not to be etched.

Figure 8:
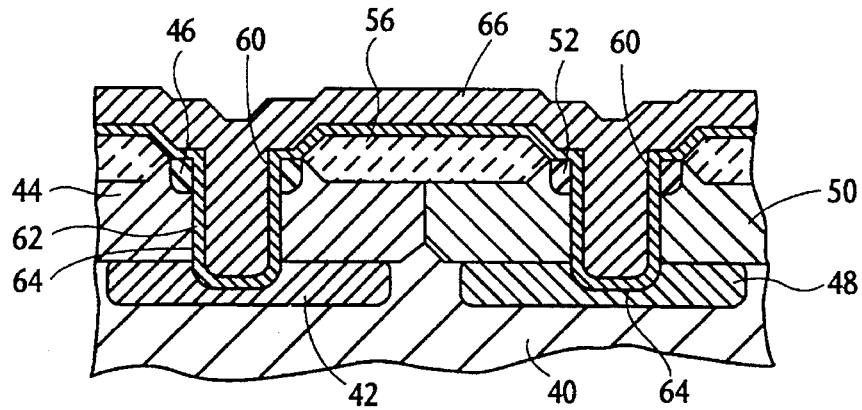

Referring to FIG. 8, Ti and TiN are deposited one after another, each by sputtering, on the entire surface of the substrate including the side walls and bottom of every contact hole 60 to form a laminate film 62 consisting of a Ti layer having a thickness of 50–150 nm and a TiN layer having a thickness of 50–150 nm. Then the Ti/TiN film 62 is rapidly heated to 700°–900° C. in order to cause reaction of Si with Ti and consequently form a titanium silicide 64, which is low in resistivity, at the interface between the Si surface and the Ti/TiN film 62. After that, tungsten 66 (or an alternative metal which is also sufficiently high in melting point) is deposited on the Ti/TiN film 62 by a CVD method until the contact holes 60 are completely filled with tungsten 66.

Figure 9:
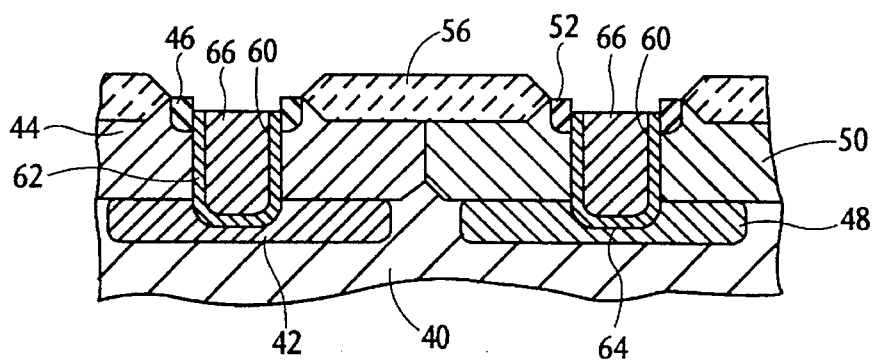

Referring to FIG. 9, etch-back of the entire surface of the tungsten layer 65 is made by producing a plasma in a fluorine-containing mixed gas to leave tungsten 66 only in the contact holes 60. In the etch-back operation the Ti/TiN film 62 under the tungsten layer 66 serves as etching stopper. After that, some Ti compounds remaining on the oxide film 54 are removed by wet etching. The tungsten 66 remaining in each contact hole 60 together with the Ti/TiN film 62 serves as the buried contact 90.

Figure 10:
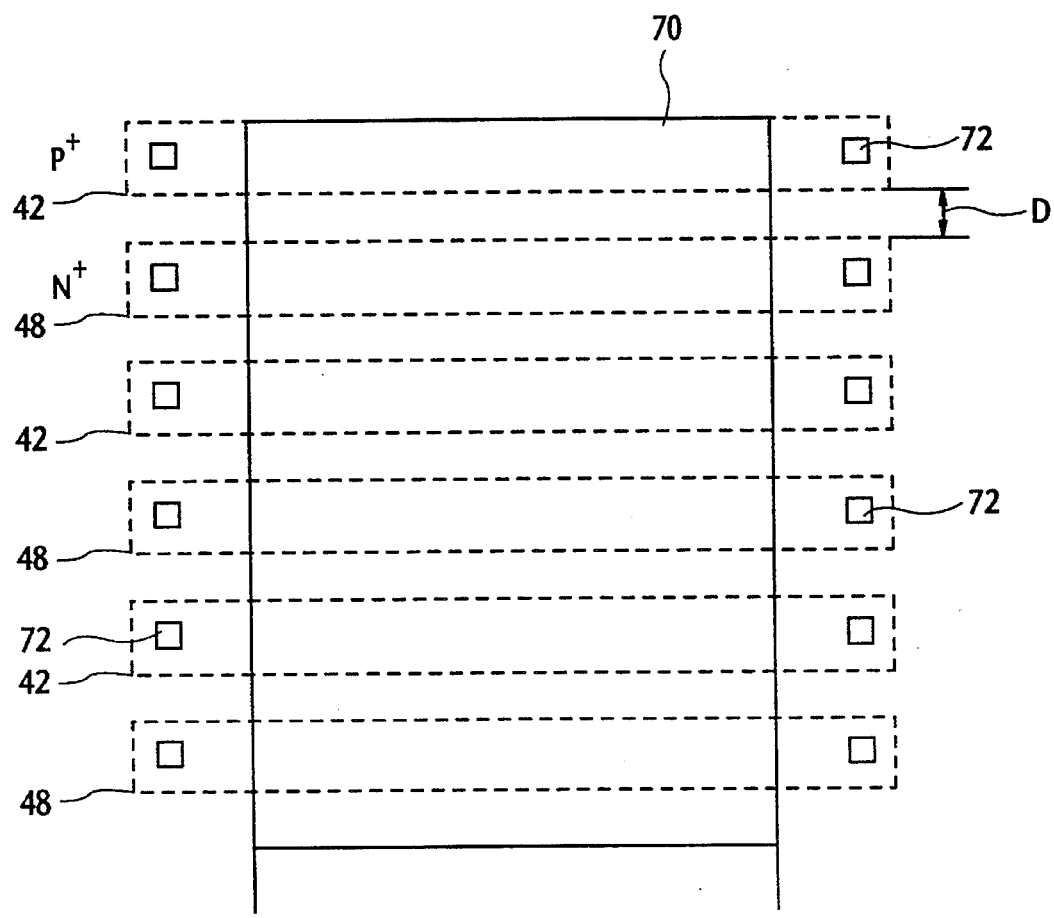
FIG. 10 is an explanatory illustration of a memory block according to the invention.

FIG. 10 illustrates a memory block 70 which is an array of a large number of memory cells having the above described buried contacts 30. Under the memory block 70, i.e. in the substrate, there are alternate rows of a plurality of $p^+$-type buried layers 42 and the same number of $n^+$-type buried layers 48 with equal spacings D. The spacing D is a distance necessary for electrical isolation of p-MOS transistors and n-MOS transistors in the memory cells from each other. Outside the memory block 70, buried contacts 72 are formed in regions above the both end regions of each of these buried layers 42, 48 in the same manner as the above described buried contacts 30 in each memory cell. That is, the buried contacts 72 penetrate into the $p^+$-type buried layer 42 or the $n^+$-type buried layer 48, and these buried contacts 72 are used to provide a supply voltage and ground potential to each memory cell via the buried contacts 30 in each memory cell. To provide the supply voltage or ground potential to each of the buried contacts 72 from the substrate surface, interconnections of aluminum (or an alternative metal) are formed by well known planarization, metallization and etching techniques.

Figure 13:
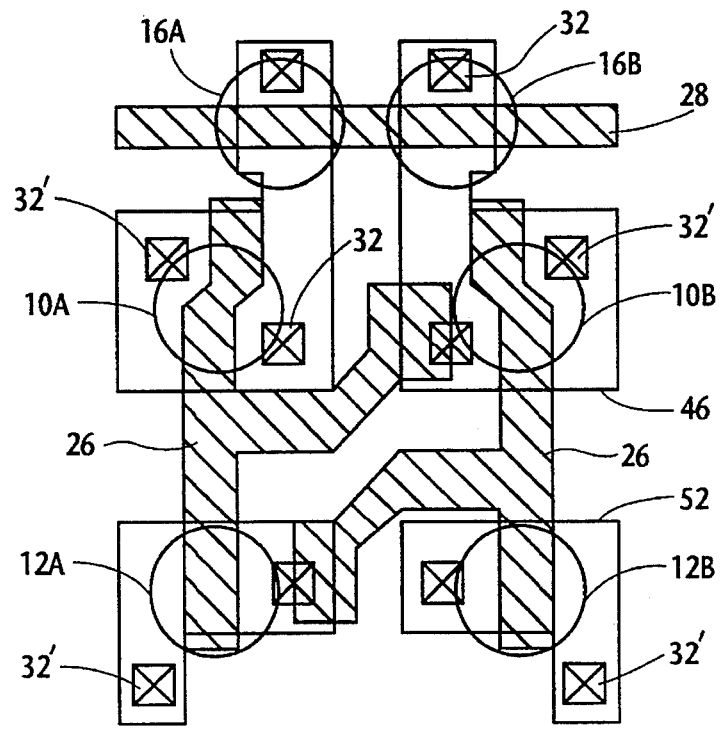
FIG. 13 is a schematic of a known layout pattern of a static memory cell.
Figure 14:
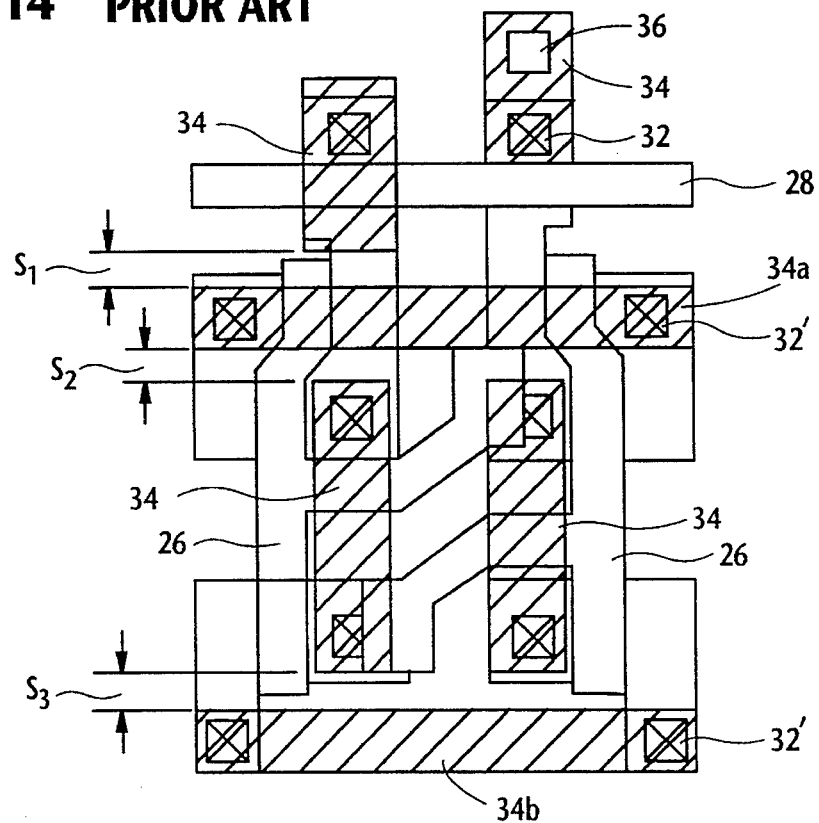
FIG. 14 shows a metal interconnection pattern formed over the memory cell of FIG. 13.

For comparison, FIGS. 13 and 14 show a known layout pattern of a static memory cell of the type shown in FIG. 1 and interconnections in a first metal layer over the memory cell. There are no buried contacts in the substrate. Instead, there is an additional contact hole 32' for each of the driver and load transistors 10A, 10B, 12A, 12B, and, as shown in FIG. 14, interconnections 34 in a first metal layer include a ground line 34a connected to the source of the driver transistors 10A, 10B and a supply line 34b connected to the source of the load transistors 12A, 12B. Therefore, the spacings between the ground line 34a or the supply line 34b and adjacent interconnection lines, indicated at $S_1$, $S_2$, $S_3$, become very narrow. When the spacings between interconnection lines are too narrow the patterning of the metal layer becomes troublesome and is likely to suffer from inaccuuracy due to insufficiency of focus margin at the stage of exposure to light. When the spacings are widened without decreasing the number of interconnection lines, a natural result is an increase in the memory cell area. These inconveniences are obviated by using the buried contacts according to the invention.

Figure 11:
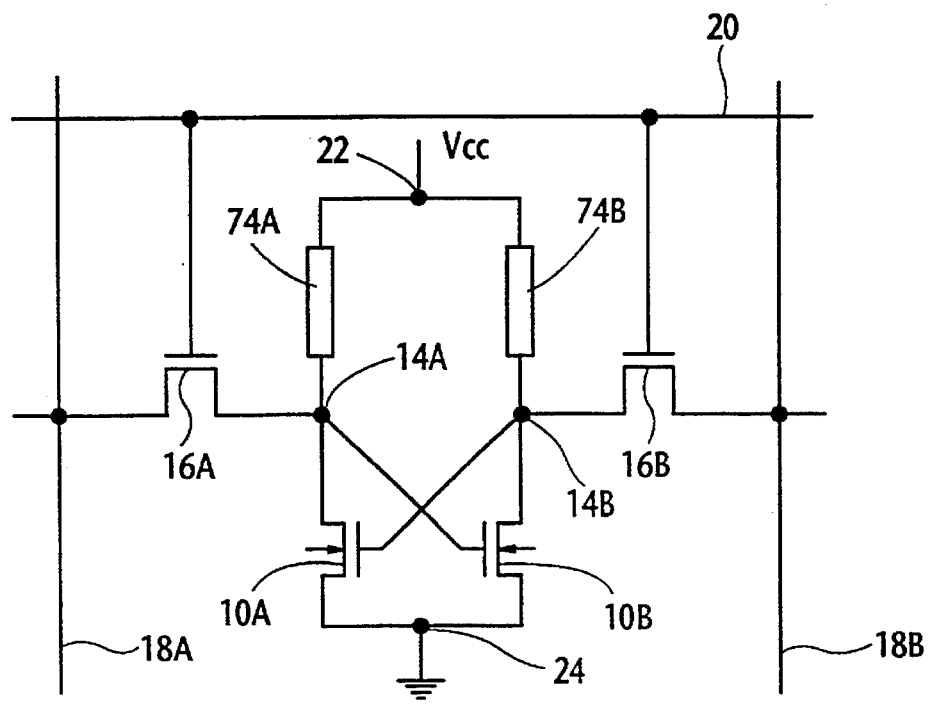
FIG. 11 is a circuit diagram of another static memory cell.
Figure 12:
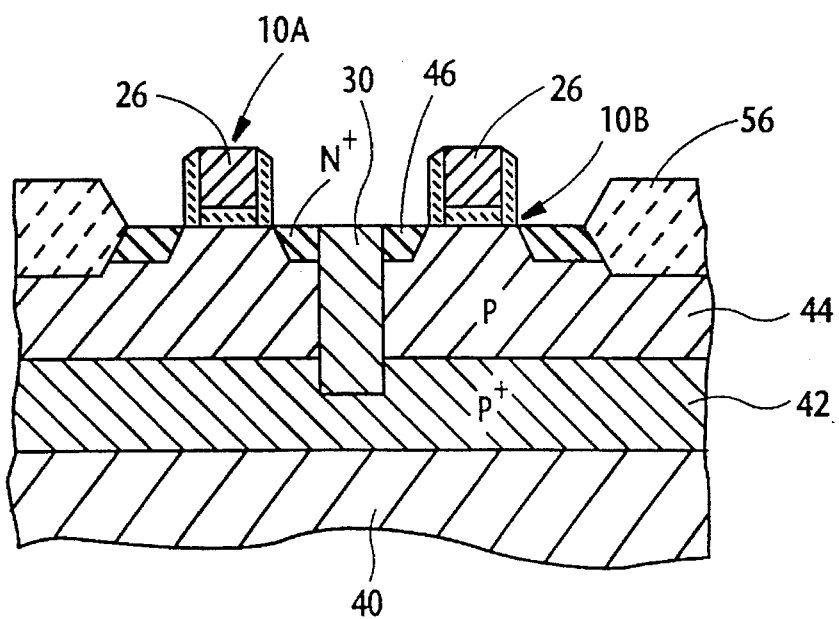
FIG. 12 shows a buried contact according to the invention in the memory cell of FIG. 11.

FIG. 11 shows the construction of a static memory cell using a pair of resistors 74A and 74B and load elements, viz. an n-MOS memory cell. Alternative to these resistors 74A, 74B, TFTs can be used. In this case the load elements 74A, 74B are fabricated in an upper layer above the substrate of the memory cell, and hence only the driver and data transmission transistors 10A, 10B, 16A, 16B are formed in the substrate. Usually these four transistors are n-MOS transistors. Therefore, as shown in FIG. 12, only a p-type well 44 and a $p^+$-type buried layer 42 are formed in the Si layer under the memory cell. The $p^+$-type buried layer 42 can be used as a ground line for the n-MOS driver transistors 10A, 10B.

As shown in FIG. 12, a buried contact 30 is formed in the $n^+$-type diffused layer 46 of the n-MOS transistors 10A, 10B so as to penetrate into the $p^+$-type buried layer 42 through the p-type well 44. The buried contact 30 is made by the method described with reference to FIGS. 6–9. Also in this case, ground potential is provided to the $p^+$-type buried layer 42 via another contact hole (72 in FIG. 10) formed outside the memory block. Naturally it is unnecessary to form a ground line in an upper layer of the memory cell, and therefore it is possible to widen the spacings between interconnection lines formed in that upper layer and consequently simplify the process operations for the fabrication of the device using resistors or TFTs in the memory cells and improve the yield.

What is claimed is:

1. In a semiconductor integrated circuit which has, on a semiconductor substrate, bipolar transistors and a static memory block consisting of a plurality of memory cells each of which has a pair of MOS transistors and a pair of load elements interconnected to constitute a flip-flop, the improvement comprising:

a first buried contact of a metal which is buried in the substrate to make ohmic connection of a diffused layer which provides the source of said MOS transistors to a buried layer which lies in the substrate under said diffused layer and is opposite in the type of conductivity to said diffused layer, and a second buried contact of said metal which is buried in the substrate at a location outside said memory block to apply a ground potential to said buried layer from the substrate surface.

2. A semiconductor integrated circuit according to claim 1, wherein said metal is tungsten.

3. A semiconductor integrated circuit according to claim 2, wherein said semiconductor substrate is a silicon substrate, said first and second buried contacts further comprising a metal silicide layer at the interface between each buried contact and the silicon substrate.

4. A semiconductor integrated circuit according to claim 3, wherein said first and second buried contacts further comprise a titanium nitride layer which is interposed between said tungsten and said metal silicide layer.

5. A semiconductor integrated circuit according to claim 1, wherein said load elements of each memory cell are a pair of MOS transistors, the integrated circuit further comprising a third buried contact of said metal which is buried in the substrate to make ohmic connection of a second diffused layer which provides the source of the MOS transistors used as the load elements to a second buried layer which lies in the substrate under said second diffused layer and is opposite in the type of conductivity to said second diffused layer, and a fourth buried contact of said metal which is formed at a location outside the memory cell to apply a supply voltage to said second buried layer from the substrate surface.

6. A semiconductor integrated circuit according to claim 5, wherein said metal is tungsten.

7. A semiconductor integrated circuit according to claim 6, wherein said semiconductor substrate is a silicon substrate, said first, second, third and fourth buried contacts further comprising a metal silicide layer at the interface between each buried contact and the silicon substrate.

8. A semiconductor integrated circuit according to claim 7, wherein said first, second, third and fourth buried contacts further comprise a titanium nitride layer which is interposed between said tungsten and said metal silicide layer.

* * * * *

UNITED STATES PATENT AND TRADEMARK OFFICE
CERTIFICATE OF CORRECTION

PATENT NO. : 5,453,640
DATED : September 26, 1995
INVENTOR(S) : Yasushi Kinoshita It is certified that error appears in the above-indentified patent and that said Letters Patent is hereby corrected as shown below:

Col. 4, line 27, delete "cleary" and insert --clearly--.

Col. 5, line 21, delete "65" and insert --66-.

Col. 5, line 65, delete "inacuuracy" and insert --inaccuracy--.

Signed and Sealed this

Seventh Day of May, 1996

Attest:

BRUCE LEHMAN

Attesting Officer   Commissioner of Patents and Trademarks